United States Patent [19]

Romano et al.

[11] Patent Number: 5,233,245

[45] Date of Patent: Aug. 3, 1993

[54] RATE CONTROLLED NOISE FILTER

[75] Inventors: Timothy J. Romano, Lisle, Ill.;
William R. Shinkle, Cincinnati, Ohio

[73] Assignee: General Electric Company, Cincinnati, Ohio

[21] Appl. No.: 763,783

[22] Filed: Sep. 23, 1991

Related U.S. Application Data

[63] Continuation-in-part of Ser. No. 683,163, Apr. 10, 1991, abandoned.

[51] Int. Cl.$^5$ .......................... H03B 1/00; H03K 5/00
[52] U.S. Cl. .................................... 307/521; 328/167
[58] Field of Search ............... 307/520, 521; 328/167; 364/724.01, 825

[56] References Cited

U.S. PATENT DOCUMENTS

| 4,322,641 | 3/1982 | Packard | 307/521 |
| 4,667,120 | 5/1987 | Okada et al. | 307/521 |
| 4,954,732 | 9/1990 | Surauer et al. | 307/521 |

Primary Examiner—Timothy P. Callahan
Attorney, Agent, or Firm—Bernard E. Shay; Jerome C. Squillaro

[57] ABSTRACT

A rate controlled noise filter according to the present invention comprises a transient detector adapted to receive an input signal and detect the rate at which the input signal is changing. The transient detector may be, for example, a filter having a second order filtered rate. The output of the transient detector is input to a function generator which outputs a signal indicative of the rate of change of the input signal. A noise filter, including a controllable time constant, also filters the input signal. The output of the function generator controls the time constant of the noise filter.

9 Claims, 3 Drawing Sheets

RATE CONTROLLED NOISE FILTER

The U.S. Government has rights in this invention pursuant to contract no. F33657-88-C-3103 awarded by the United States Air Force.

This application is a continuation-in-part of application U.S. Ser. No. 07/683,163 filed Apr. 10, 1991.

The present invention relates, in general, to noise filters and, more particularly, to a novel rate controlled noise filter.

BACKGROUND OF THE INVENTION

Sensor noise is a common problem encountered in analog and digital control systems. In most situations, the noise must be reduced or, if possible, eliminated. In filtering sensor output signals, it would be desirable to detect changes in the sensor signal and adjust the noise filtering accordingly. For example, it would be desirable to adjust the filter such that the filter time constants do not detrimentally effect the sensor output during desirable changes in the sensor input.

In one common approach, noise is reduced by incorporating hysteresis in a feedback loop. Hysteresis can substantially reduce or eliminate noise. However, if noise spikes are of significant amplitude, hysteresis may decrease static accuracy and add delay to the system in the frequency range of operation. Hysteresis can also induce limit cycles. Including hysteresis in the feedback may also involve incorporating non-linear elements, and non-linearities may degrade system performance. To minimize detrimental effects, the hysteresis halfwidth may be chosen to eliminate most of the noise. However, with reduced hysteresis halfwidth, noise spikes greater than the halfwidth will pass through the filter, at a reduced amplitude.

Another common approach to noise reduction is to filter the noisy signal with a first or higher order filter. Filters do not normally possess the undesirable characteristics of a hysteresis. However, if the noise peaks are of significant amplitude, the time constant(s) required to provide sufficient noise attenuation may adversely impact transient response.

SUMMARY OF THE INVENTION

A rate controlled noise filter according to the present invention comprises a transient detector adapted to receive an input signal and detect the rate at which the input signal is changing. In one preferred embodiment, the transient detector may be, for example, a filter having a second order filtered rate. The output of the transient detector is input to a function table which outputs a signal indicative of the rate of change of the input signal. A noise filter, including a controllable time constant, which filters the input signal. The output of the function generator controlling the time constant of the noise filter.

According to a further embodiment of the present invention, the transient detector comprises a first filter for receiving and filtering the input signal, a summing junction adapted to subtract the filtered input signal from the unfiltered input signal and a second filter adapted to filter the subtracted signal.

According to a further embodiment of the present invention, the first, second and noise filters may be first order lag filters. Further, the function generator may be a lookup table.

According to a further embodiment of the present invention, the transient detector comprises a summing junction and a filter, wherein the summing junction sums the input and output signals and generates a difference signal which is filtered by the filter.

BRIEF DESCRIPTION OF THE DRAWINGS

The novel features of the invention are set forth with particularly in the appended claims. The invention itself, however, both as to organization and method of operation, together with further objects and advantages thereof, may best be understood by reference to the following description taken in conjunction with the accompanying drawings in which:

DETAILED DESCRIPTION OF THE INVENTION

Figure 1:
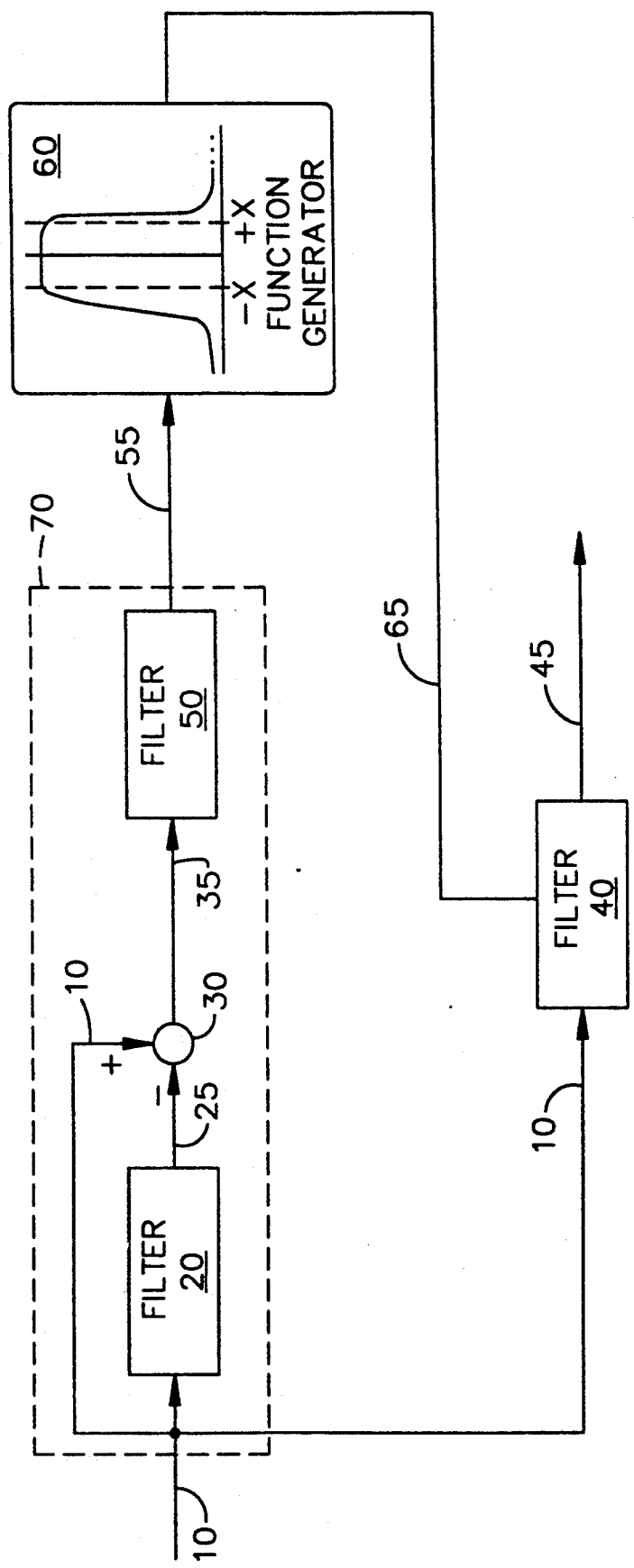
FIG. 1 illustrates one embodiment of the present invention.

A rate controlled noise filter according to the present invention is illustrated in FIG. 1. In FIG. 1, input signal 10 is directed to filter 20, a summing junction 30 and filter 40. The output 25 of first filter 20 is directed to a second input of summing junction 30. Signal 25 may be subtracted from signal 10 in summing junction 30. The output 35 of summing junction 30 is directed to filter 50. The output 55 of filter 50 is directed to the input of function generator 60. The output 65 of function generator 60 is directed to a control input of filter 40. The output 45 of filter 40 is the output of the rate controlled noise filter according to the present invention. In FIG. 1, first filter 20, summing junction 30 and third filter 50 form transient detector 70.

Filter 20 may be constructed of, for example, discrete components, or it may be implemented in a software routine. First filter 20 may have the following (laplacian) transfer characteristics:

$$O(s) = [A/(\beta s + 1)] * I(s)$$

where,

O(s) is the laplace transform of output signal 25;
A is a gain constant equal to, for example, 1;
$\beta$ is the time constant of filter 20;
s is the laplace transform operator; and
I(s) is the laplace transform of input signal 10.

Transient detector 70 further includes summing junction 30. Summing junction 30 may be any of a number of well known summing junction circuits or may be implemented in a software routine. The output 35 of summing junction 30 is representative of the difference (delta) between the input signal 10 and the filtered input signal 25.

Filter 50 may be, for example, a first order lag filter. Filter 50 may be constructed of, for example, discrete components, or it may be implemented in a software routine. Transient filter 50 may have the following (laplacian) transfer characteristics:

$$O(s) = [A/(\beta s + 1)] * I(s)$$

where,

O(s) is the laplace transform of output signal 55;
A is a gain constant equal to, for example, 1;

β is the time constant of filter 50;
s is the laplace transform operator; and
I(s) is the laplace transform of input signal 35.

Filter 40 is a noise filter. Filter 40 is adapted to filter noise from input signal 10. It would be advantageous to adjust the time constant of noise filter 40 according to the rate of change of input signal 10.

Filter 40 may be, for example, a first order lag filter. Filter 40 may have the following (laplacian) transfer characteristics:

$$O(s) = [A/(Ts+1)] * I(s)$$

where,
O(s) is the laplace transform of output signal 45;
A is a gain constant equal to, for example, 1;
T is the time constant of filter 40;
s is the laplace transform operator; and
I(s) is the laplace transform of input signal 10.

The time constant T of noise filter 40 may be, for example, a continuous function of signal 65. Alternatively, time constant T of noise filter 40 may be, for example, a discretely variable function of signal 65. Thus, according to the present invention, the time constant of filter 40 is a function of the output 65 of function generator 60.

Function generator 60 may be, for example, a multiplication circuit wherein input signal 55 is multiplied by a first multiplier if it is between $+X$ and $-X$ and by a second multiplier if it is greater than $+X$ or less than $-X$. X may be preselected according to the noise in input signal 10. Alternatively, function generator 60 may be, for example, a lookup table wherein the value of signal 55 is matched to a discrete output signal 65.

When the input signal 10 is being changed rapidly, it would be advantageous if filter 40 provided little or no filtering, since filtering delays output signal 45. Therefore, during periods when input signal 10 is changing rapidly, it would be advantageous if the time constant (T) of filter 40 were extremely small.

Alternatively, during periods when input signal 10 is relatively stable, it would be advantageous to provide the maximum noise filtering in order to reduce the effect of noise on output signal 45. Therefore, during periods when input signal 10 is relatively stable, it would be advantageous if time constant (T) of filter 40 were large enough to filter out extraneous noise.

Therefore, according to one embodiment of the present invention, transient detector 70 is designed such that when input signal 10 is changing rapidly, output signal 55 (the filtered delta) of transient detector 70 falls outside the range $-X$ to $+X$. When the output of transient detector 70 falls outside the range $-X$ to $+X$, the output 65 of function generator 60 is minimized. minimizing the time constant (T) of filter 40. When input signal 10 is not changing rapidly, output 55 of transient detector 70 falls within the range $-X$ to $+X$ and the output of function generator 60 is maximized, increasing the time constant (T) of filter 40 to a value sufficient to ensure proper noise filtering of signal 10.

The transfer function of transient detector 70, as described previously, normally represents a second order filtered rate.

Figure 2:
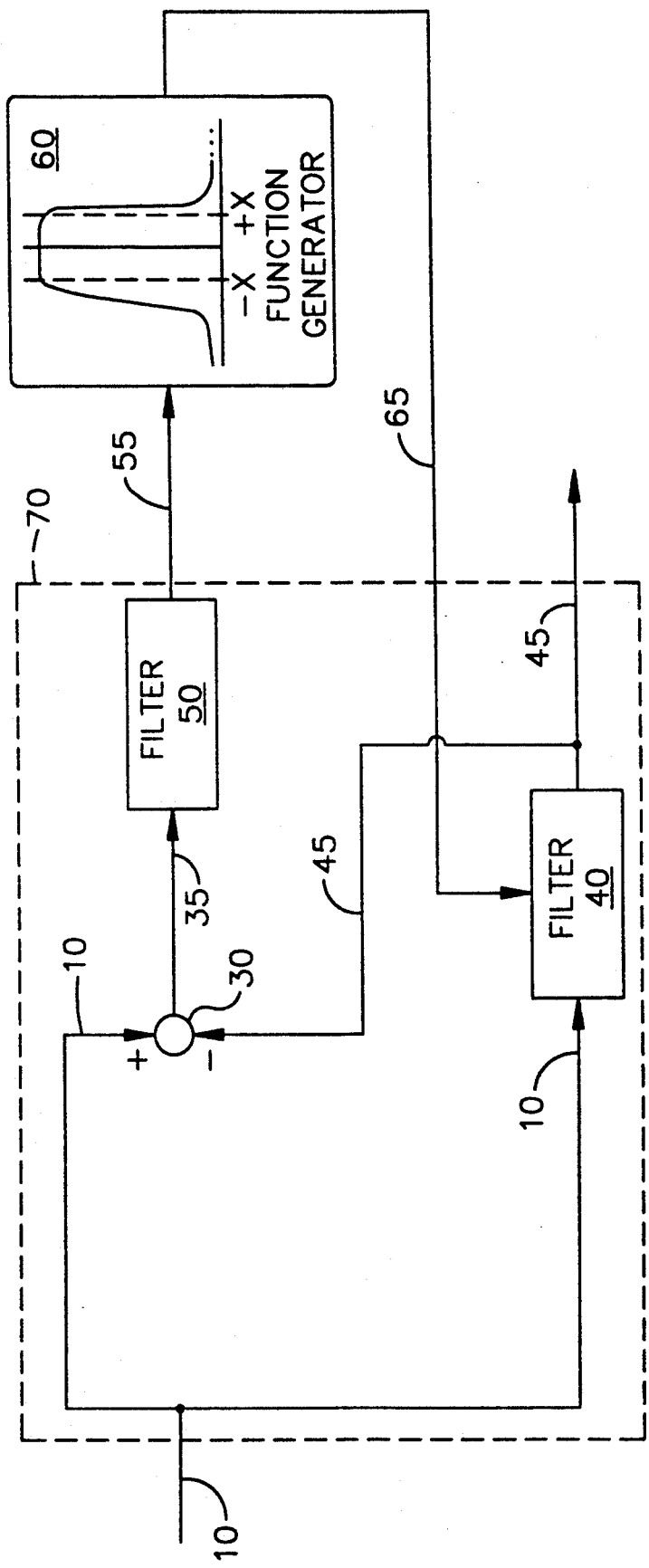
FIG. 2 illustrates a second embodiment of the present invention.

A second embodiment of a rate controlled noise filter according to the present invention is illustrated in FIG. 2. In FIG. 2, like elements of the embodiment illustrated in FIG. 1 are illustrated with like reference numbers. In FIG. 2, filter 20 has been eliminated. Filter 40 provides the filtering provided by filter 20 in FIG. 1. The second input to summing junction 30 is output signal 45. Therefore, input signal 10 is compared directly with output signal 45 to obtain signal 35. In this embodiment, transient detector 70 comprises summing junction 30 and filter 40 and 50. Function generator 60 controls the time constant of filter 40 according to the output, signal 55, of transient detector 70.

Figure 3:
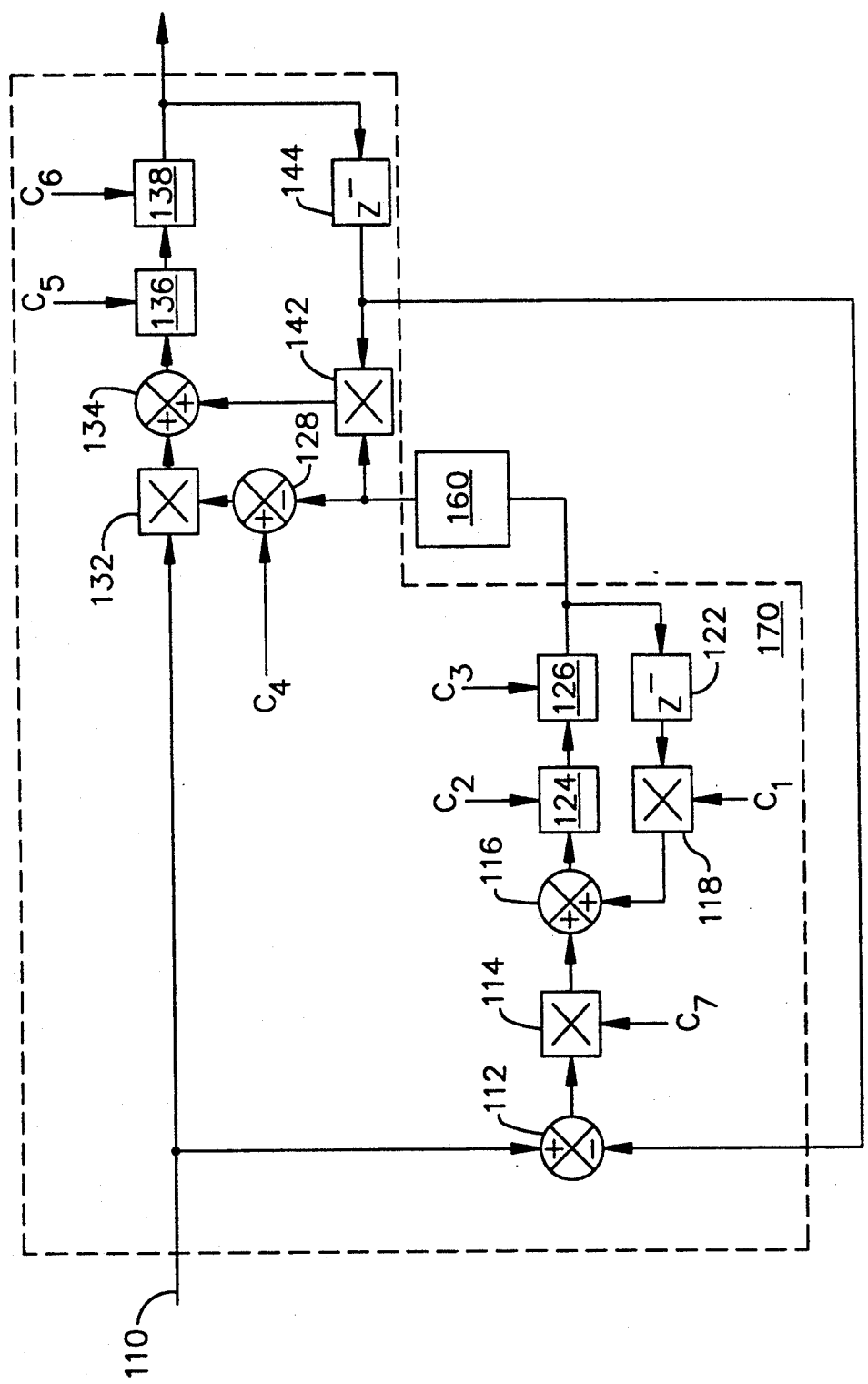
FIG. 3 illustrates a third embodiment of the present invention.

FIG. 3 is a block diagram of a preferred embodiment of the present invention which may be implemented in digital logic. In FIG. 3, summing circuit 112 receives input signal 110 and subtracts from that signal the output of delay circuit 144. Delay circuits such as circuit 144 are designed to delay the input signal by one or more time periods. The symbol $z^{-1}$ is referred to as a "z transform" and represents a delay of one time period in the digital domain. Therefore, circuit 144 may be a latch and hold circuit or any other suitable delay circuit.

In FIG. 3, multiplier circuit 114 receives the output of summer 112 and multiplies it by a constant $C_7$. Constant $C_7$ is selected to control the gain of transient detector 170. Normally, constant $C_7$ and constant $C_1$ are selected such that:

$$C_7 + C_1 = 1.$$

When $C_7 + C_1$ is equal to 1, the gain of transient detector 170 is 1. In one preferred embodiment, $C_7$ is 0.22 and $C_1$ is 0.78.

Summer 116 in FIG. 3 sums the output of multiplier 114 with the output of multiplier 118. Comparison circuit 124, which may be, for example, a comparator, compares the output of summer 116 with a predetermined minimum limit $C_2$. If the output of summer 116 is less than $C_2$. the output of comparison circuit 124 is $C_2$. If the input of comparison circuit 124 is greater than $C_2$, the output of comparison circuit 124 is equal to its input. Comparison circuit 126 compares its input to a maximum limit $C_3$. If the input of comparison circuit 126 is less than $C_3$, comparison circuit 126 output is equal to its input. If the input of comparison circuit 126 is greater than $C_3$, its output is $C_3$.

It will be apparent to those of skill in the art that comparison circuits 124 and 126 are acting as a min/max select circuit, preventing the output of transient detector 170 from exceeding predetermined minimum and maximum limits. In one embodiment of the present invention, $C_2$ may be, for example, $-0.35$ and $C_3$ may be, for example $+0.35$. It will also be apparent that it is not necessary to include comparison circuits 124 and 126 in the embodiment illustrated in FIG. 3, delay circuit 122 and function generator 160 may receive the output of summing circuit 116 directly.

In FIG. 3, the output of comparison circuit 126 is feedback to delay circuit 122 which delays the input by one time period. Multiplier 118 multiplies the output of delay circuit 122 by constant $C_1$. Constant $C_1$ is selected to be, for example, between zero and one. $C_1$ is selected to reduce the feedback gain. $C_1$ in combination with $C_7$ apply a lag on the output of transient detector 170.

Function generator 160 receives the output of transient detector 170. Function generator 160 may be, for example, a lookup table. In the embodiment illustrated in FIG. 3, the output of function generator 160 is a first, high value if the output of transient detector 170 is between $+X$ and $-X$. The output of function generator 160 is a second, low value (for example zero) if the output of transient detector 170 is greater than +x or less than −X.

In the embodiment of FIG. 3, time constant gain $C_1$ and $C_7$ may be derived from the equations:

$$C_7 = e^{(-DT/T)}$$

and $$C_1 = 1 - e^{(-DT/T)}$$

where:
DT a one time period delay, and
T is the time constant of the filter.

Summer 128 receives the output of function generator 160 and subtracts it from constant $C_4$ which may be, for example 1. Multiplier 132 multiplies the output of summer 128 by input 110. Summer 134 adds the output of multiplier 132 to the output of feedback multiplier 142. Comparator circuits 136 and 138 act as select min, select max circuits. The selected min may be, for example $C_5$ and the selected max may be, for example $C_6$. In one preferred embodiment, $C_5$ is 95.0 and $C_6$ is −5.0.

A Rate Controlled Noise Filter according to the present invention is adapted to eliminate severe noise without adversely impacting transient response time.

It will be apparent to those of skill in the art that one or more of the filter transfer functions for filters 20, 40 and 50 can be of higher order (i.e. second, third or forth order), and all filter time constants may be functions of filtered delta signal 55.

It will also be apparent to those of skill in the art that any of the filters described herein may be implemented by discrete networks, alternatively, digital elements may be used or the filters may be implement in software.

It will be apparent to those of skill in the art that the block diagram of FIGS. 1, 2 or 3 may be implemented in software, using discrete components, by a mixture of hardware and software or by any other convenient method.

While preferred embodiments of the present invention have been shown and described herein, it will be obvious to those skilled in the art that such embodiments are provided by way of example only. Numerous variations, changes and substitutions will now occur to those skilled in the art without departing from the invention. Accordingly, it is intended that the invention be limited only by the spirit and scope of the appended claims.

What we claim is:

1. A rate controlled noise filter comprising:
a first filter which receives an input signal;
a second filter which receives said input signal;
a summing junction which receives said input signal at a first input, and an output signal from said first filter at a second input;
a third filter which receives an output signal from said summing junction; and
a function generator which receives an output from said third filter and which generates a signal which controls a time constant of said second filter.

2. A rate controlled noise filter according to claim 1 wherein:
said first, second and third filters are first order lag filters; and
said function generator is a lookup table.

3. A rate controlled noise filter according to claim 2 wherein:

said second filter has a transfer function of:

$$O(s) = [A/(Ts+1)] * I(s)$$

where,
O(s) is the laplace transform of output signal of said filter;
A is a gain constant;
T is an adjustable time constant of said filter;
s is the laplace transform operator; and
I(s) is the laplace transform of input signal to said filter.

4. A rate controlled noise filter according to claim 3 wherein:
said first and third filters have a transfer function of:

$$O(s) = [A/(\beta s+1)] * I(s)$$

where,
O(s) is the laplace transform of output signals of said filters;
A is a gain constant;
$\beta$ is the time constant of said filters;
s is the laplace transform operator; and
I(s) is the laplace transform of input signals to said filters.

5. A rate controlled noise filter comprising:
a transient detector which receives an input signal;
a function generator which receives an output of said transient detector; and
a controllable filter which receives said input signal wherein a time constant of said controllable filter is controlled by an output signal from said function generator;
said transient detector comprising:
a first filter which receives said input signal;
a summing junction which receives an output signal from said first filter at a first input and said input signal at a second input; and
a second filter which receives an output signal from said summing junction.

6. A rate controlled noise filter comprising:
a transient detector which receives an input signal;
a function generator which receives an output of said transient detector; and
a controllable filter which receives said input signal wherein a time constant of said controllable filter is controlled by an output signal from said function generator;
said transient detector comprising:
a summing junction which receives an output signal from said controllable filter at a first input and said input signal at a second input; and
a first filter which receives an output signal from said summing junction.

7. A rate controlled noise filter comprising:
a first summing junction which receives an input signal and a modified output signal;
a first filter circuit which receives an output of said first summing junction;
a function generator which receives an output of said first filter circuit;
a first multiplier circuit which receives said input signal and an output signal from said function generator;
a second filter circuit which receives an output of said first multiplier circuit wherein, said modified output signal is generated by said second filter circuit.

8. A rate controlled noise filter according to claim 7 wherein:

said first filter circuit comprises:
- a first filter summer circuit which receives an output from said first summing junction and adds said input to a first feedback signal;
- a first min/max circuit which receives an output of said summer and generates a first filter output signal;
- a first delay circuit which receives said first filter output signal and generates said first feedback signal.

9. A rate controlled noise filter according to clam 8, wherein;

said second filter comprises:
- a second filter summer circuit which receives an output from said first multiplier circuit and adds said output from said first multiplier circuit to a second feedback signal;
- a second min/max circuit which receives an output of said summer and generates a second filter output signal;
- a second delay circuit which receives said second filter output signal and generates said modified output signal;
- a multiplier circuit which receives said modified output signal and an output from said function generator and generates said feedback signal.

* * * * *